United States Patent [19]

Manley et al.

[11] Patent Number: 5,108,939

[45] Date of Patent: Apr. 28, 1992

[54] METHOD OF MAKING A NON-VOLATILE MEMORY CELL UTILIZING POLYCRYSTALLINE SILICON SPACER TUNNEL REGION

[75] Inventors: Martin H. Manley, San Jose; Michael J. Hart, Palo Alto; Philip J. Cacharelis, Menlo Park, all of Calif.

[73] Assignee: National Semiconductor Corp., Santa Clara, Calif.

[21] Appl. No.: 598,221

[22] Filed: Oct. 16, 1990

[51] Int. Cl.⁵ .................... H01L 21/76; H01L 21/265
[52] U.S. Cl. ..................................... 437/43; 437/195; 437/978; 437/979
[58] Field of Search ...................... 437/43, 52, 44, 979, 437/978, 195; 357/23.5

[56] References Cited

U.S. PATENT DOCUMENTS

| | | |
|---|---|---|
| 4,794,565 | 12/1988 | Wu et al. ............................. 357/23.5 |
| 4,812,885 | 3/1989 | Riemenschneider ............... 357/23.5 |
| 4,822,750 | 4/1989 | Perlegos et al. ...................... 437/43 |
| 4,931,847 | 6/1990 | Corda ................................. 357/23.5 |
| 5,019,879 | 5/1991 | Chiu ..................................... 437/43 |
| 5,021,848 | 6/1991 | Chiu ..................................... 437/43 |

FOREIGN PATENT DOCUMENTS

| | | |
|---|---|---|
| 0298430 | 1/1989 | European Pat. Off. ........... 357/23.5 |
| 0335395 | 10/1989 | European Pat. Off. . |
| 0061470 | 3/1986 | Japan . |

OTHER PUBLICATIONS

"A 16KB Electrically Erasable Nonvolatile Memory" by W. Johnson et al., *1980 IEEE International Solid-State Circuits Conference*, p. 152.

Primary Examiner—Brian E. Hearn
Assistant Examiner—C. Chaudhari
Attorney, Agent, or Firm—Steven F. Caserza; Irv Rappaport

[57] ABSTRACT

A method and structure for forming in an EEPROM memory transistor a tunnel dielectric region having an extremely small surface area. A floating gate region is formed in the conventional manner above a gate dielectric layer. The drain region is exposed utilizing photolithographic techniques and the gate dielectric removed therefrom. A thin layer of tunnel dielectric is then formed on the exposed drain region. A thin layer of polycrystalline silicon is then formed and etched in order to create very narrow floating gate extensions of polycrystalline silicon along the edge of the previously formed floating gate. The floating gate extension formed in this manner which overlies the drain region is separated from the drain region by thin tunnel dielectric. A dielectric is then formed on the device in order to provide a dielectric over the drain region which has a greater thickness than the tunnel dielectric underlying the floating gate extension.

13 Claims, 12 Drawing Sheets

(PRIOR ART) FIG. 1C

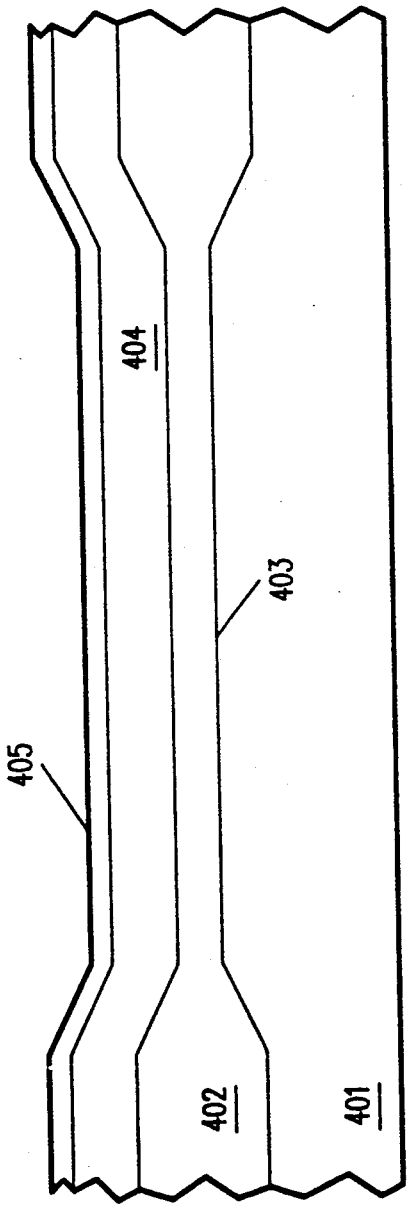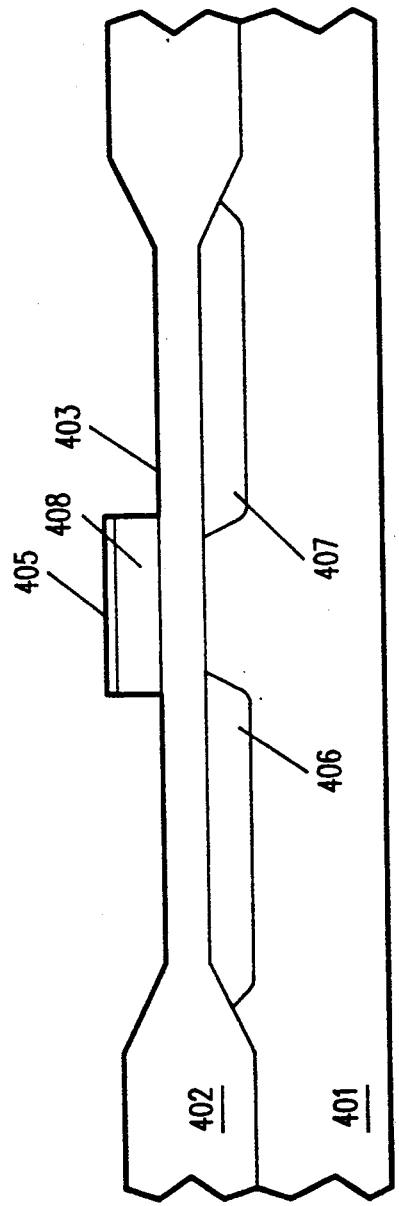

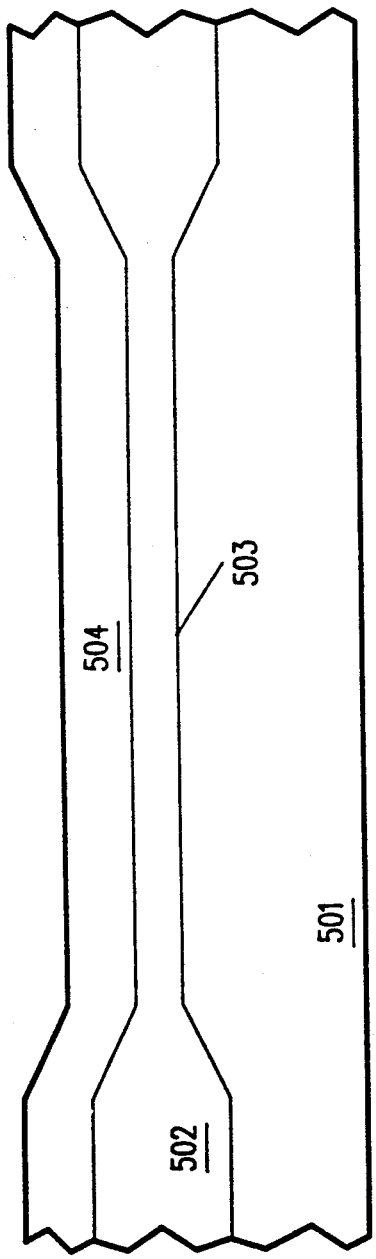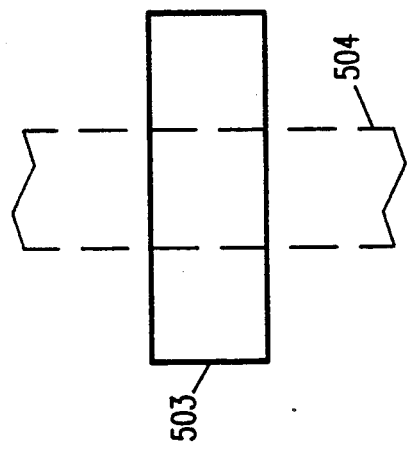
FIG. 5A
FIG. 5B

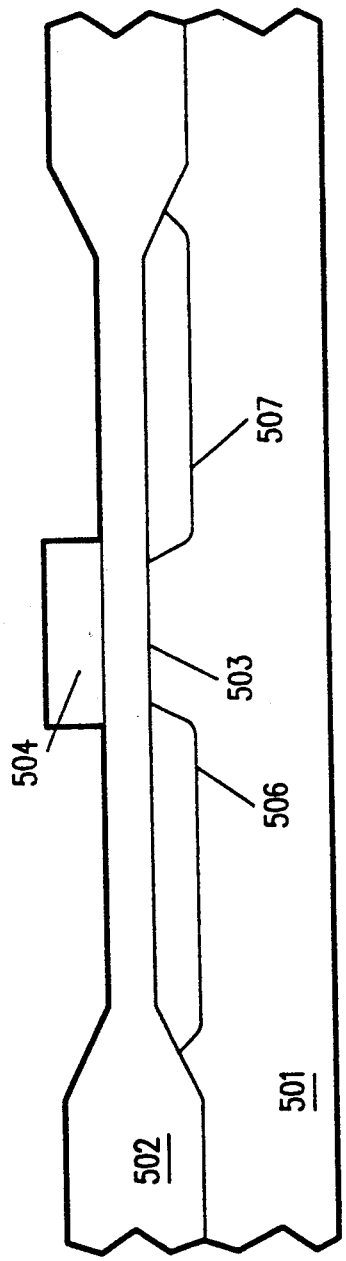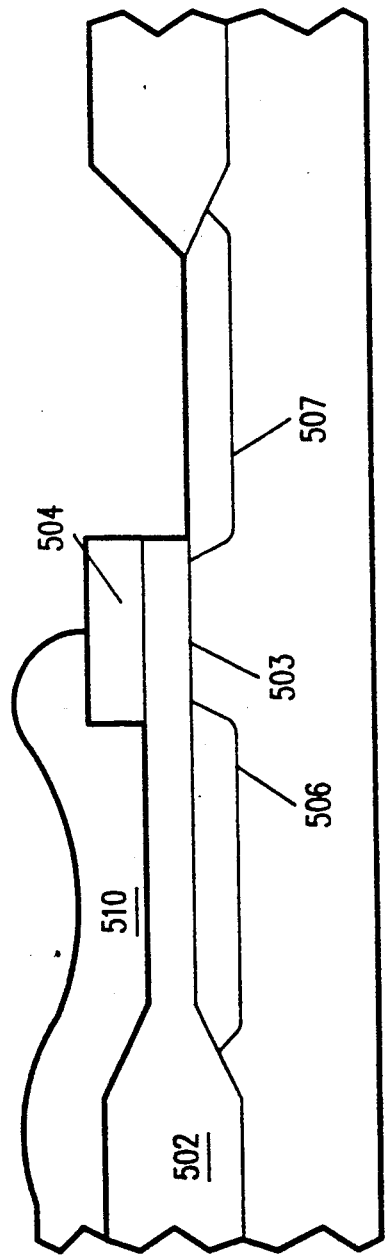

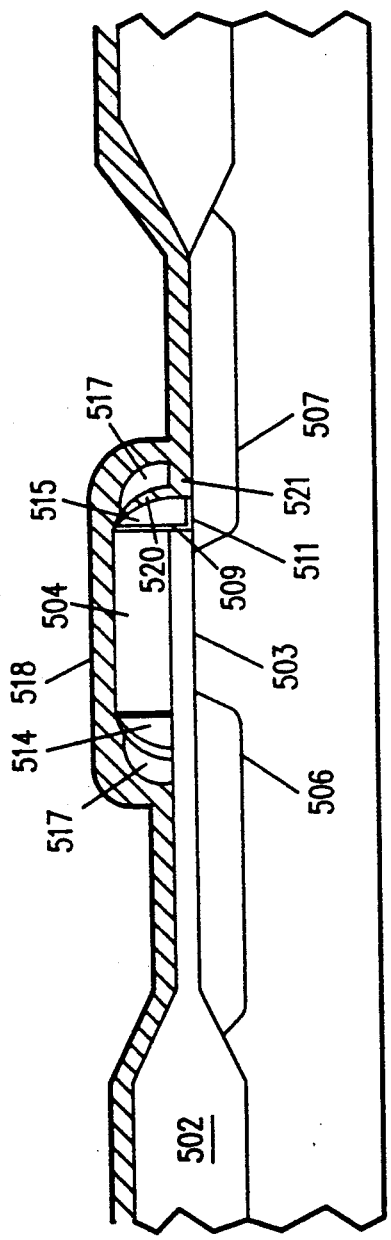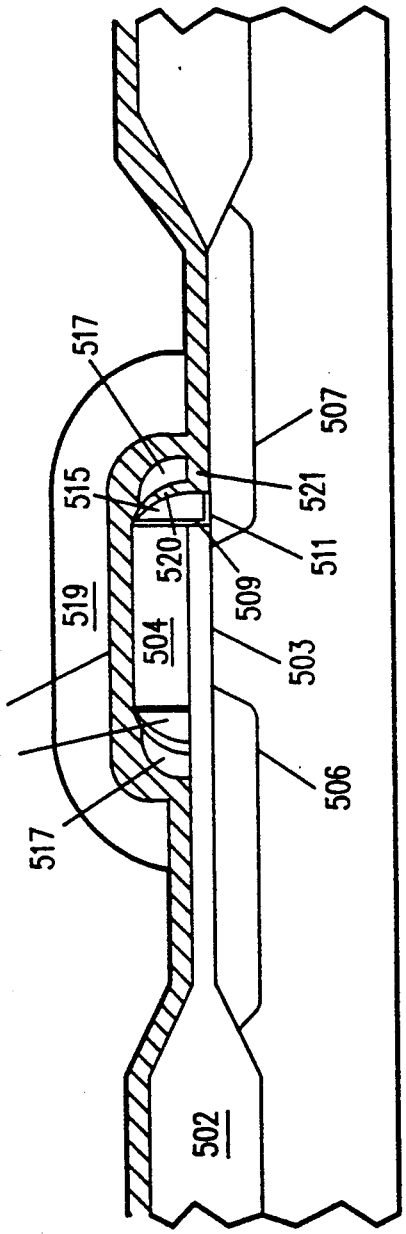
FIG. 5L
FIG. 5M

METHOD OF MAKING A NON-VOLATILE MEMORY CELL UTILIZING POLYCRYSTALLINE SILICON SPACER TUNNEL REGION

INTRODUCTION

1. Technical Field

This invention pertains to non-volatile semiconductor memory cells, and in particular to a non-volatile memory cell utilizing a polycrystalline silicon spacer for the formation of a small tunnel oxide region, thereby providing a very small cell size and high coupling ratio.

2. Background

Non-volatile memory cells are well known in the prior art and include a floating gate region to which charge may be stored or removed. A charge present on the floating gate alters the control gate threshold voltage which must be applied to a control gate in order to cause the memory cell transistor to turn on. For electrically erasable programmable read-only memories (EEPROM), the charge is stored or removed from the floating gate by either hot carrier injection or Fowler-Nordheim tunneling through a thin tunneling dielectric. For devices which utilize Fowler-Nordheim tunneling, the creation of a small tunnel oxide region is a critical step in the fabrication of the EEPROM cell.

A typical EEPROM cell layout is shown in both plan and cross-sectional views in FIGS. 1a and 1b, respectively, and an equivalent circuit is shown in FIG. 1c which models the capacitances of the cell. Referring to FIGS. 1a and 1b, substrate 101 is a P-type substrate or well region within a substrate. EEPROM cell 100 includes memory transistor 105 and access transistor 106. N type region 102 serves as the source of memory transistor 105, N type region 103 serves as the drain of memory transistor 105 and the source of access transistor 106, and N type region 104 serves as the drain of access transistor 106. Above channel region 109 of memory transistor 105 and channel region 113 of access transistor 106 lies gate dielectric 108, typically oxide. Above this lies a first layer of polycrystalline silicon 107 serving as the floating gate of memory transistor 105. Between floating gate 107 and drain 103 of memory transistor 105 lies thin tunnel oxide 110 which is typically formed to a thickness of approximately 80 to 100Å and occupies an area of approximately 1 square micron. Located above floating gate 107 is inter-gate dielectric 114. A second layer of polycrystalline silicon, for example, serves as control gate 115 of memory transistor 105 and gate 112 of access transistor 106. The entire device is covered with insulation layer 116 except where electrical contact 117, for example, is formed for electrical access by an overlying metalization layer (not shown).

EEPROM cell 100 is programmed and erased by applying an electric field of approximately 10 MV/cm across tunnel oxide 110, which thereby causes electrons to tunnel through tunnel oxide 110 either onto or off of floating gate 107, depending on the polarity of the electric field.

FIG. 2 is a schematic diagram depicting memory transistor 105 and series access transistor 106 of FIG. 1b, with appropriate voltages applied to cause erasing of memory cell 105 by causing electrons to be stored on floating gate 107 by tunneling through tunnel oxide 110 (FIG. 1b).

The voltage which is applied across tunnel oxide 110 in order to transport electrons onto or off of floating gate 107 is dependent upon programming voltage $V_{pp}$ and the coupling ratio which is determined by the capacitances of the various elements of the EEPROM cell (depicted in FIG. 1c). Thus, the voltage $V_{fg}$ of the floating gate during programming or erasure is equal to $$V_{fg} = \gamma \cdot V_{pp}; \quad (1)$$

where, the coupling ratio $\gamma$ is equal to $$\gamma = \frac{C_{lpox}}{C_{lpox} + C_s + C_{sub} + C_d + C_{tunox}}; \text{ where} \quad (2)$$

Thus, it is seen from equation (1) that for strong programming and erasure, the programming/erasure voltage $V_{pp}$ should be large, and the coupling ratio $\gamma$ should be large.

In early EEPROM devices, an external pin was made available for the user to apply high programming and erase voltages. This has the disadvantage of requiring one or more pins on the integrated circuit package, as well as requiring the system utilizing the EEPROM to supply a high programming/erase voltage. More modern EEPROM devices include circuitry on the integrated circuit itself to generate programming/erase voltages which are higher than the voltage $V_{cc}$ powering the device. In most EEPROM technologies, however, there is an upper limit on the programming/erase voltage which can be generated by the integrated circuit from the power supply voltage $V_{cc}$. This implies that the coupling ratio $\gamma$ is a significant figure of merit for an EEPROM cell, since an EEPROM cell with a low coupling ratio $\gamma$ will require a higher programming/erase voltage $V_{pp}$ for adequate programming and erasure. In most EEPROM cell layouts, the capacitance of the tunnel oxide region is a primary factor in determining the coupling ratio of the EEPROM cell since, as seen from equation (2), the higher the tunnel oxide capacitance Ctunox, the poorer the coupling ratio $\gamma$. As a consequence, great care is taken to minimize the surface area of the tunnel oxide region, thereby minimizing the capacitance associated with the tunnel oxide region.

FIGS. 3a through 3c show plan views of three alternative prior art techniques for defining the tunnel oxide region in an EEPROM memory transistor. In FIG. 3a, the tunnel oxide region 303 is defined as a minimum-feature hole which is cut in gate oxide 301 underlying floating gate 302. In FIG. 3b, tunnel oxide region 303 is defined by the intersection of a first layer of polycrystalline silicon 302 serving as the floating gate and a cut 304 in the gate dielectric 301 underlying polycrystalline silicon layer 302. In FIG. 3c, the tunnel oxide region 303 is defined by the intersection of a strip 304 cut in gate dielectric layer 301 and a strip of diffused region 305. Each technique shown in FIGS. 3a through 3c seek to minimize the area of the tunnel oxide region underlying the floating gate. The minimum area of the tunnel oxide region provided in accordance with the prior art techniques of FIGS. 3a through 3c is approximately equal to the square of the minimum feature size that can be printed utilizing a given fabrication process. Thus, for a fabrication process in which the minimum feature size is 1 micron, the minimum area of the tunnel oxide region which is formed in accordance with the techniques of FIGS. 3a through 3c is approximately 1 square micron.

While providing a tunnel oxide region having an area which is as small as a square of the minimum geometry which can be printed in a given fabrication process is helpful in reducing the capacitance associated with the tunnel oxide region, it is highly desirable to further minimize the capacitance associated with the tunnel oxide region. Therefore, it is desirable to find alternative techniques for minimizing the surface area associated with the tunnel oxide region.

It should be noted that all of the prior art structures for forming the tunnel oxide region, shown in FIGS. 3a through 3c, occupy a significant amount of surface area. By way of illustration, FIG. 3d shows a cross-section of a conventional EEPROM cell which uses the technique shown in FIG. 3a to form the tunnel region. In this cell, the structures associated with the tunnel oxide region, and the associated overlaps of the N+, Poly 1 and Poly 2 regions occupy a space shown as L1 on FIG. 3d. L1 may be reasonably estimated as four times the minimum geometry of the process (a total of 4 microns in a 1 micron process). The width of the cell might typically be 5 microns, and so the total cell area associated with the tunnel oxide structure might be 20 square microns for a 1 micron process. This area represents a significant proportion of the total cell area, and it would be very desirable to reduce the area required.

SUMMARY OF THE INVENTION

In accordance with the teachings of this invention, a novel method and structure are taught for forming in an EEPROM memory transistor a tunnel dielectric region having an extremely small surface area, much smaller than is possible utilizing conventional photolithographic techniques. In accordance with the teachings of this invention, a floating gate region is formed in the conventional manner above a gate dielectric layer. The drain region is then exposed utilizing photolithographic techniques and the gate dielectric removed therefrom. A thin layer of tunnel dielectric is then formed on the exposed drain region. A thin layer of polycrystalline silicon is then formed and etched in order to create very narrow floating gate extensions of polycrystalline silicon along the edge of the previously formed floating gate. The floating gate extension formed in this manner which overlies the drain region is separated from the drain region by thin tunnel dielectric. A dielectric is then formed on the device in order to provide a dielectric over the drain region which has a greater thickness than the tunnel dielectric underlying the floating gate extension.

In this manner, a floating gate transistor is formed in which the tunnel dielectric is located beneath a floating gate extension, and has a surface area significantly smaller than possible when forming the tunnel dielectric region utilizing standard photolithographic techniques.

It is therefore one objective of the present invention to provide a means of creating a tunnel oxide region within a memory cell of smaller dimensions than could be defined by conventional lithography. It is another objective of the present invention to create such a tunnel region whose size can be controlled to very tight tolerances by means of conventional process techniques. It is another objective of the present invention to reduce the size of the overlap and spacing rules associated with the prior art techniques for forming a tunnel oxide region in order to significantly reduce the size of the memory cell.

BRIEF DESCRIPTION OF THE DRAWINGS

FIG. 1b shows a cross-sectional view of the prior art EEPROM memory cell of FIG. 1a;

FIG. 1c is a model depicting the various capacitances of the structure of FIG. 1a;

FIG. 2 is a schematic diagram modeling the programming operation of the structure of FIG. 1a;

FIG. 3d is a cross-sectional view depicting a typical art EEPROM cell of FIG. 3a;

FIGS. 4a through 4g depict cross-sectional views depicting one embodiment of a process for forming an EEPROM memory cell in accordance with the teachings of this invention;

FIGS. 5a through 5m are cross-sectional views depicting the fabrication of an alternative embodiment of an EEPROM memory cell constructed in accordance with the teachings of this invention;

DETAILED DESCRIPTION

Figure 1A:
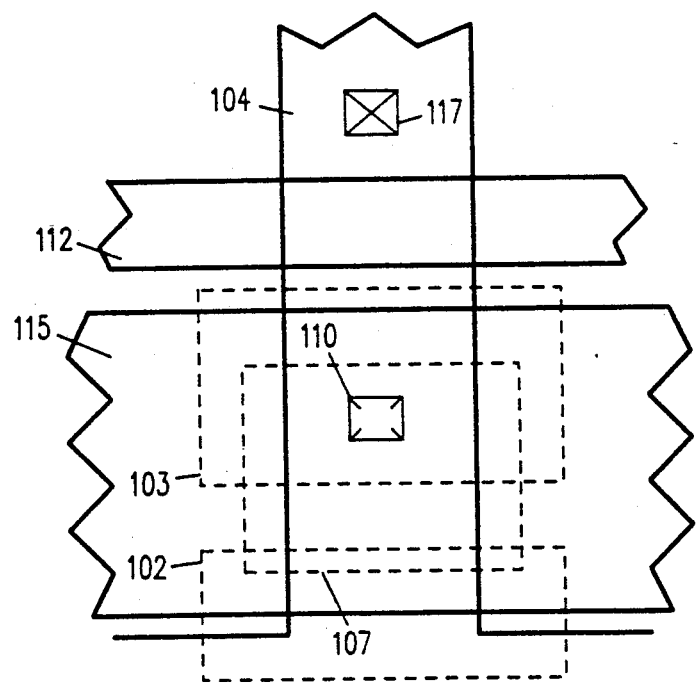
FIG. 1a shows a plan of the typical prior art EEPROM memory cell.
Figure 1B:
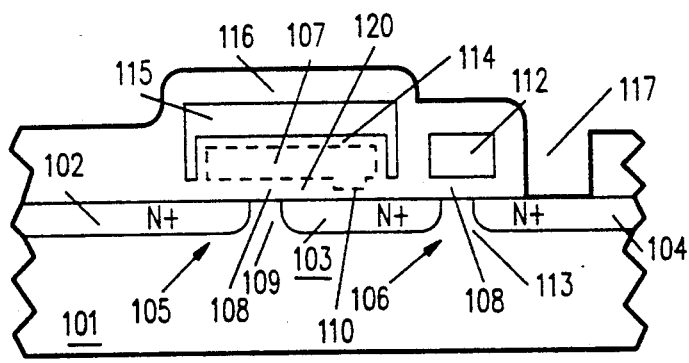
Figure 2:
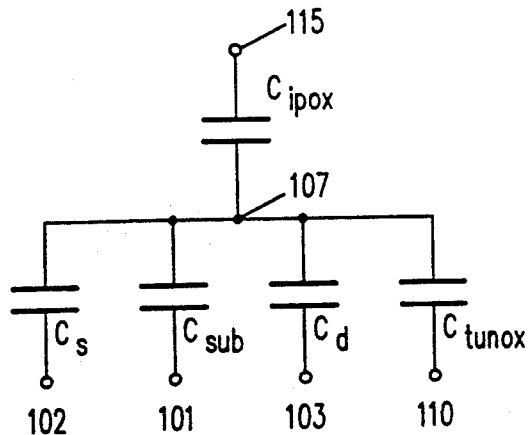
Figure 2:
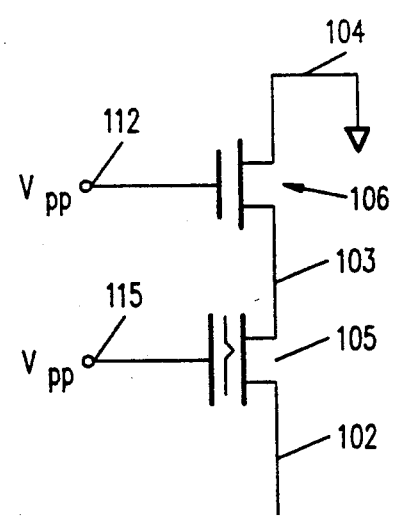

FIGS. 4a through 4g depict one embodiment of a processing sequence used to fabricate an EEPROM memory transistor in accordance with the teachings of this invention. For simplicity, only the floating gate EEPROM memory transistor portion of the EEPROM memory cell is shown in FIGS. 4a through 4g, and the access transistor is not shown.

Referring to FIG. 4a, an active region is first defined within substrate 401 by forming relatively thick field oxide 402 in nonactive areas, as is well known in the art. A layer of gate dielectric 403 is then formed, for example, of oxide having a thickness of approximately 300Å. A first layer 404 is then formed of material suitable for use as a floating gate, for example by deposition of polycrystalline silicon to a thickness of approximately 3000Å, which is then doped to increase its conductivity, as desired. For example, polycrystalline silicon layer 404 is doped with phosphorus to have a sheet resistivity within the range of approximately 30 ohms/square to 100 ohms/square. A layer of dielectric 405 is then formed, for example an oxide-nitride-oxide (ONO) sandwich, to a thickness of approximately 300Å.

As shown in FIG. 4b, ONO layer 405 and polycrystalline silicon layer 404 are then patterned, for example, utilizing a layer of photoresist (not shown) and conventional photolithographic techniques. Exposed portions of ONO layer 405 and polycrystalline silicon layer 404 are then removed, for example, by utilizing a plasma etch, to form floating gate region 408. N+source region 406 and N+drain region 407 are then formed, for example, by ion implantation of arsenic at approximately 80 keV to a dosage of approximately $1 \times 10^{15} \text{cm}^{-2}$. An inert ambient anneal at, for example, 900° C. is performed in order to remove the damage caused by the arsenic implant.

Figure 4C:
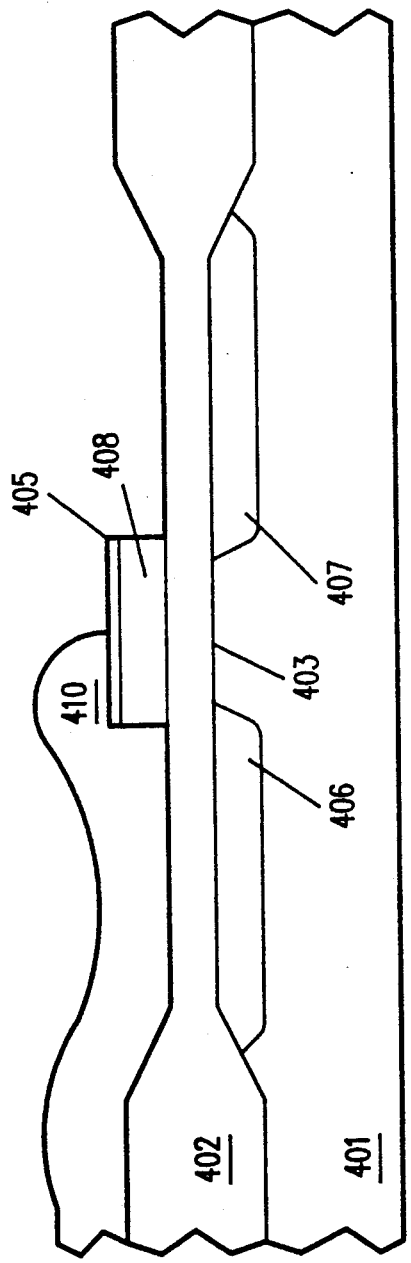

As shown in FIG. 4c, another photoresist layer 410 is then formed and photolithographically patterned in a well-known manner in order to expose drain 407. Exposed gate dielectric layer 403 lying above drain 407 is then removed, for example, by etching with buffered HF.

Figure 4D:
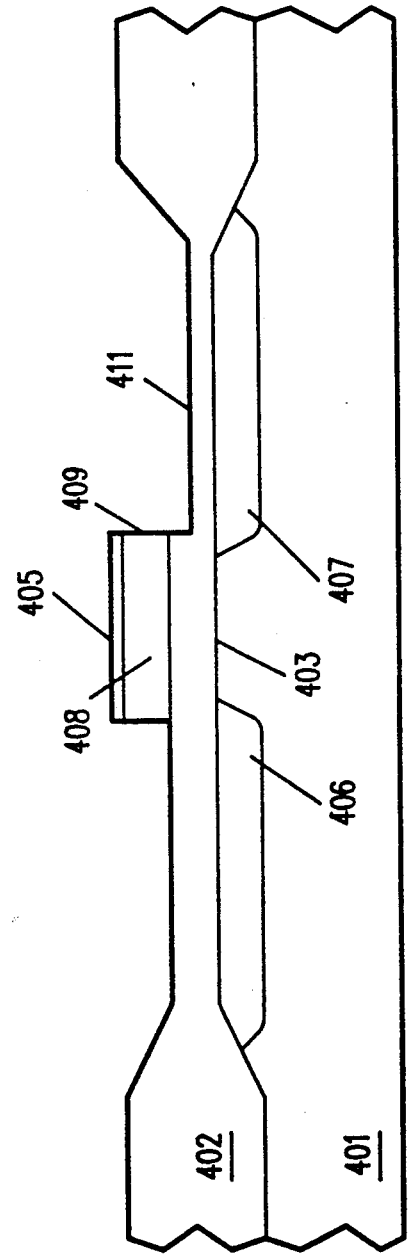

Photoresist layer 410 is then removed and, as shown in FIG. 4d, tunnel dielectric layer 411 is formed on drain 407. Tunnel dielectric 411 is formed, for example, by depositing or growing oxide to a thickness within the range of approximately 80 to 100Å above drain 407. In this example, thin oxide layer 409 is also formed on the side of polycrystalline silicon gate 408. This oxidation process also slightly thickens field oxide 402 and that portion of gate dielectric 403 overlying source 406, although this is unimportant.

It is to be understood that tunnel dielectric 411 need not be oxide, but may be any other suitable material, for example silicon nitride.

At this time, another photoresist mask 412 (shown in the plan view of FIG. 4e) is applied to selectively remove the oxide formed on the surface of portions 420, 421 of the sidewalls of polycrystalline silicon layer 408 which lies above field oxide 402. These openings 420, 421 are used to allow electrical contact between to-be-formed extensions 414, 415 and floating gate 408. This etch may be performed with buffered HF.

Figure 4F:
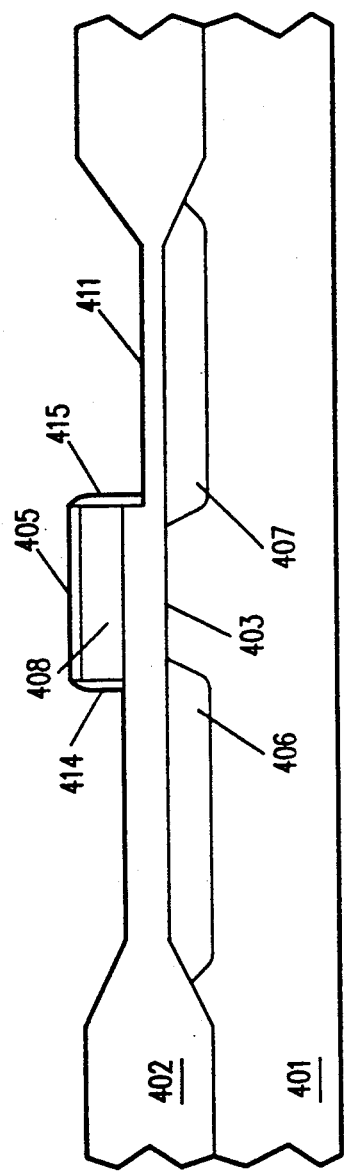
Figure 4E:
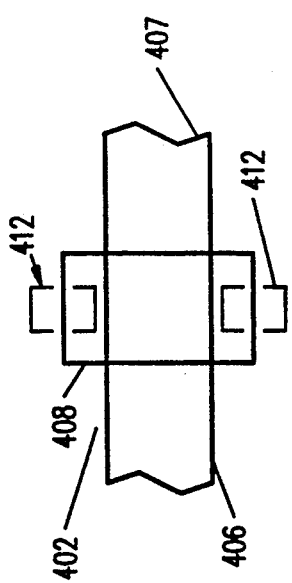
Figure 4G:
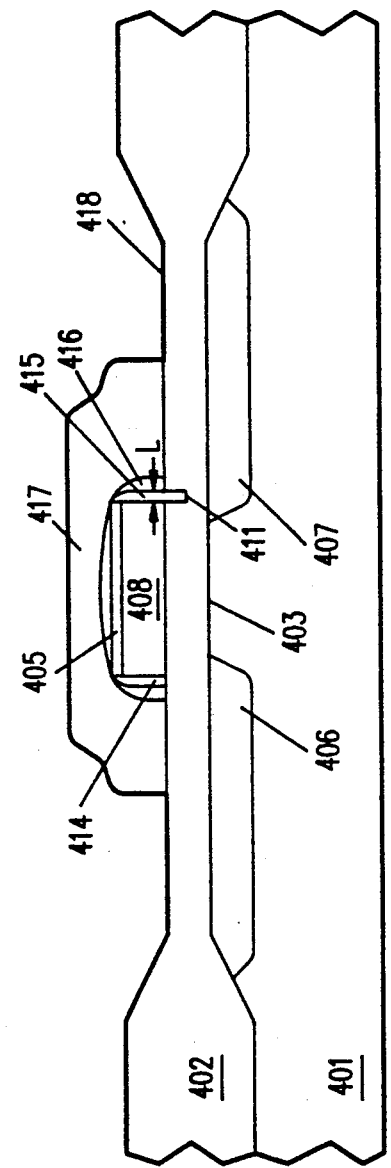

Referring to FIG. 4f, a thin layer of polycrystalline silicon is deposited to a thickness of approximately 2000Å and doped to increase its conductivity, as desired. An anisotropic etch, for example, utilizing chlorine plasma, is then used to create narrow polycrystalline silicon gate extensions 414 and 415. The width of extension regions 414 and 415 is, for example, within the range of approximately 1500 to 2000Å. Polycrystalline silicon floating gate extensions 414 and 415 are electrically connected to the first layer of polycrystalline silicon forming floating gate 408 by means of the hole which was etched in the sidewall oxide as described previously with regard to FIG. 4e;

As shown in FIG. 4g, insulating layer 416 is formed on top of polycrystalline silicon floating gate extensions 414 and 415, as well as to re-seal ONO layer 405 which lies on the top of floating gate 408. This relatively thick dielectric layer is formed, for example, by oxidation to form dielectric layer 416 to a thickness of approximately 800Å. This oxidation will increase the thickness of exposed oxide 418 on drain region 407 to approximately 300Å, but have little effect on the thickness of dielectric layer 405, due to the oxidation-resistant nitride layer. A second layer of polycrystalline silicon is then formed to a thickness of approximately 4000Å and doped to increase its conductivity, as desired. This second layer of polycrystalline silicon is then patterned utilizing well known techniques in order to form control gate 417 of the EEPROM cell, as shown in FIG. 4g.

Figure 3A:
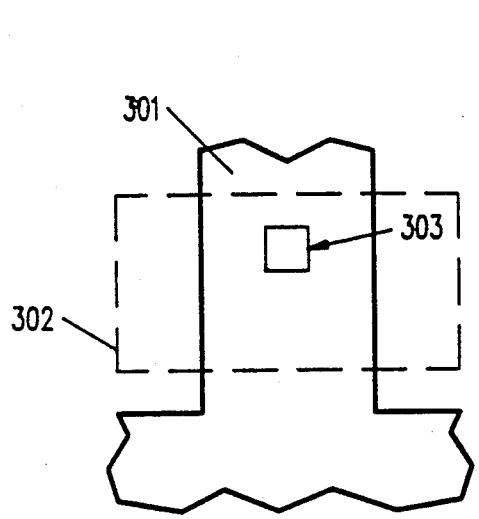
FIGS. 3a through 3c are plan views depicting three prior art techniques for forming tunnel oxide regions of small dimension.
Figure 3B:
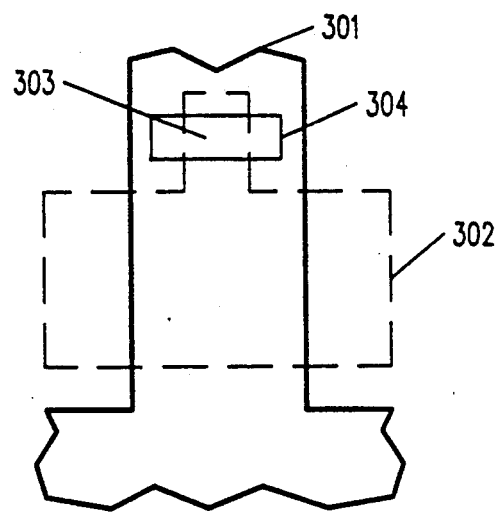
Figure 3C:
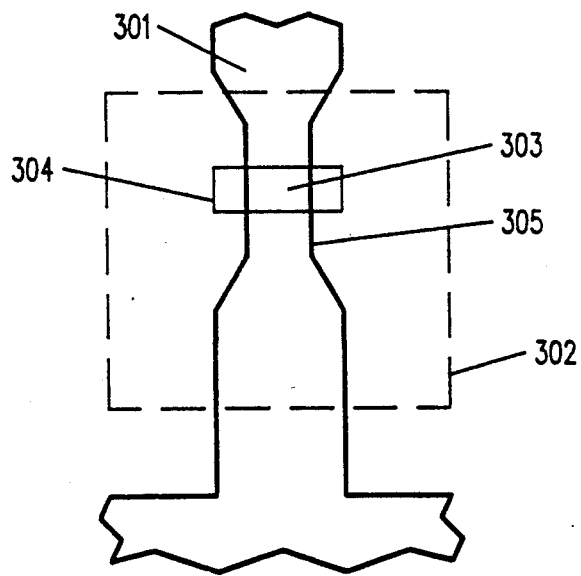
Figure 3D:
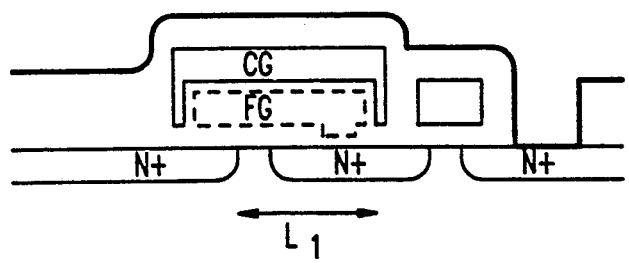

In accordance with the teachings of this invention, tunnel dielectric region 411 is formed under polycrystalline silicon gate extension 415 above drain region 407. The surface area of tunnel dielectric region 411 formed in accordance with the teachings of this invention is given by the product of the width of the active area (in a direction looking into the sheet containing FIG. 4g) and the length L of polycrystalline silicon gate extension 415. The minimum length L of polycrystalline silicon spacer 415 is a function of the uniformity of deposition of the polycrystalline silicon region which forms gate extension 415 and the uniformity of the etching process used to define gate extension 415. In one embodiment, utilizing 1 micron photolithographic technology, the minimum width of the active region is 1 micron, and the length L of polycrystalline silicon gate extension 415 is within the range of approximately 0.15 to 0.2 microns. Accordingly, the surface area of tunnel dielectric region 411 is within the range of approximately 0.15 to 0.2 square microns, as contrasted with the prior art value of approximately 1 square micron. Thus, in accordance with the teachings of this invention, the surface area of the tunnel dielectric region, and thus the capacitance associated therewith, is decreased by a factor of seven over the prior art, with attendant gains in the coupling ratio, thereby greatly improving programmability and erasability for a given programming/erase voltage. Furthermore, since the minimum surface area required for tunnel dielectric 411 is, in accordance with the teachings of this invention, significantly less than the minimum area which may be fabricated with a given photolithographic process, it is possible to reduce the size of the memory transistor constructed in accordance with the teachings of this invention such that it can be made considerably smaller than was possible with the prior art. The method for the formation of an EEPROM memory cell, and the resulting structure, provides for self-alignment of tunnel oxide region 411 to floating gate 408, without the overlaps required to provide tolerance for potential misalignment of the floating gate and tunnel oxide, as is evident in the prior art structure of FIG. 3d. Thus, in accordance with the teachings of this invention, considerable savings in the area required to provide an EEPROM memory cell as compared to the prior art by providing a small tunnel oxide area, which is furthermore self-aligned to the floating gate. For example, in a 1 micron process, the area associated with the tunnel oxide region and its associated overlaps as shown in FIG. 3d are reduced from 20 square microns to approximately 6 square microns by the use of this invention.

FIGS. 5a through 5m depict the fabrication of an alternative embodiment of the EEPROM memory cell in accordance with the teachings of this invention.

In FIG. 5a, an active region is first defined within substrate 501 by forming relatively thick field oxide 502 in nonactive areas, as is well known in the art. A layer of gate dielectric 503 is then formed, for example of oxide having a thickness of approximately 300Å. A first layer 504 is then formed of a material suitable for use as a floating gate, for example by deposition of polycrystalline silicon to a thickness of approximately 3000Å which is then doped to increase its conductivity as desired. For example, layer 504 is doped with phosphorus to have a sheet resistivity within the range of approximately 30 to 100 ohms/square.

Layer 504 is then patterned, for example by well known photolithographic and plasma etching techniques, as shown in plan view in FIG. 5b. It is important to note that layer 504 is only etched in the direction perpendicular to the active region 503, leaving a long strip of polycrystalline silicon.

N+source region 506 and drain region 507 are then formed, for example, by implantation of Arsenic at approximately 80 keV to a dosage of approximately $1 \times 10^{15}$ atom/cm$^2$ as shown in FIG. 5c.

Photoresist layer 510 is then formed and patterned in order to expose drain region 507. The exposed gate dielectric 503 lying above drain 507 is then removed, for example by etching with buffered HF.

Figure 5E:
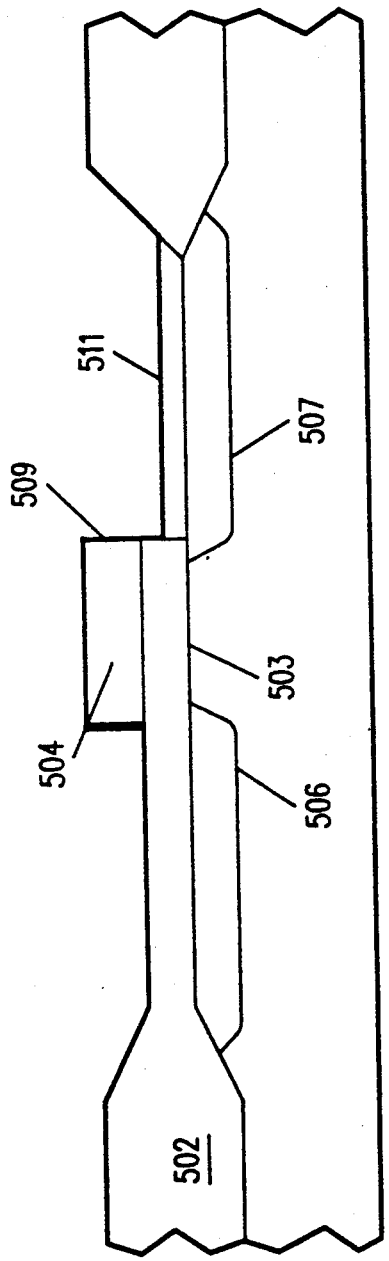

Photoresist layer 510 is then removed, and an anneal is performed to remove the damage caused by the Arsenic implant. As shown in FIG. 5e, a tunnel dielectric 511 is formed on top of drain region 507, for example by forming 80 to 100Å of oxide in a well known manner. This step also forms an oxide 509 on the top and sidewall of floating gate 504, and slightly thickens the exposed gate oxide 503 above source region 506.

Figure 5F:
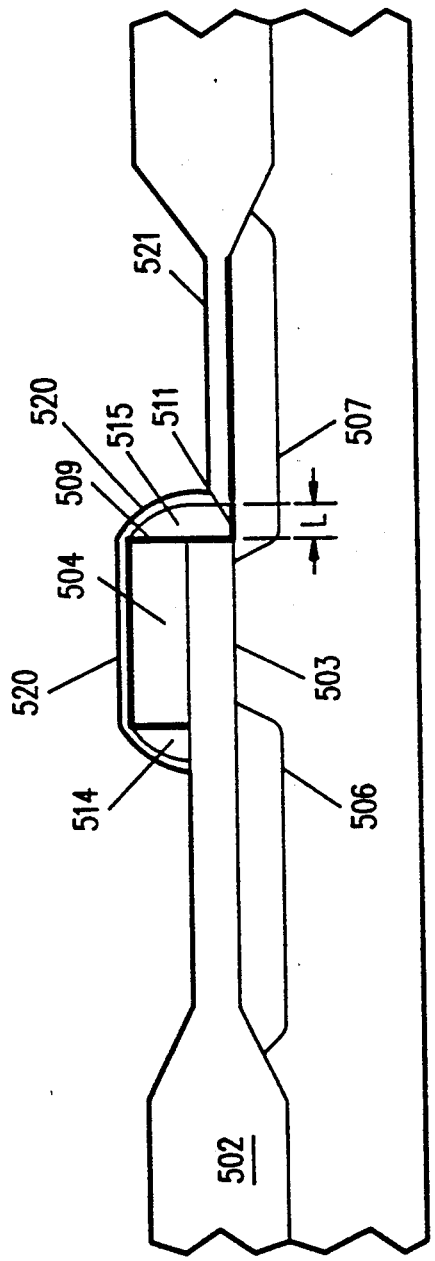

In FIG. 5f, a thin layer of polycrystalline silicon is deposited to a thickness of approximately 2000Å and doped to increase its conductivity as desired. An anisotropic etch, for example using chlorine plasma, is then used to create narrow floating gate extensions 514 and 515. The length L of these extensions is, for example, approximately 1500 to 2000Å. It should be noted that at this point in the fabrication process, floating gate extensions 514 and 515 may not be electrically connected to floating gate 504, due to the thin oxide 509 present on its sidewall. In accordance with this embodiment, this connection will be effected later. A significant advantage of this embodiment is that tunnel dielectric 511 is immediately covered and protected by polycrystalline silicon spacer 515, with no intervening process steps. It is well known in the industry that exposure of thin tunnel dielectrics to processing steps such as photoresist processing and etching steps can seriously degrade the quality of the tunnel dielectric. After formation of floating gate extensions 514 and 515, oxide layer 521 is formed on drain region 507. Dielectric 521 may comprise, for example, silicon dioxide formed to a thickness within the range of approximately 200–300Å, and may be formed by thermal oxidation. Such a thermal oxidation step will also simultaneously form silicon dioxide layer 520 to a thickness within the range of approximately 400–500Å, on floating gate 504 and extensions 514 and 515.

Figure 5G:
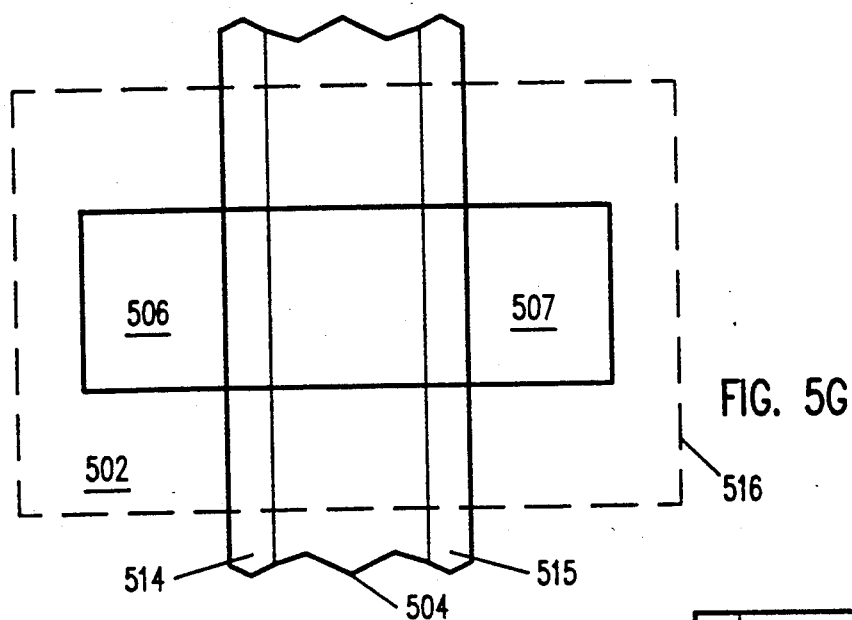
Figure 5H:
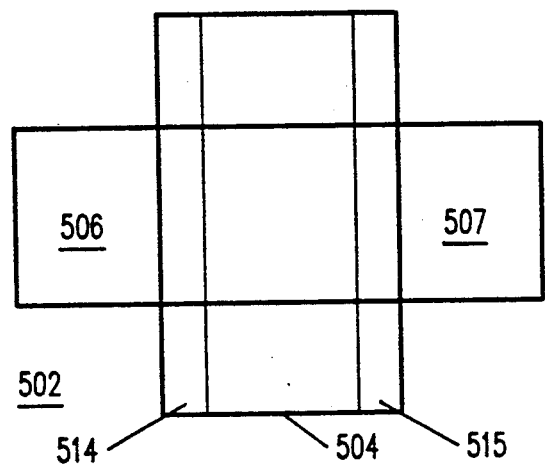
Figure 5I:
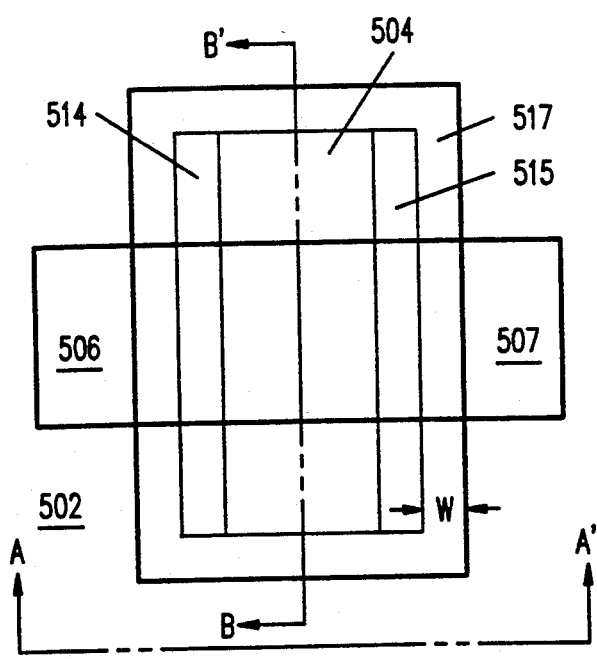
Figure 5J:
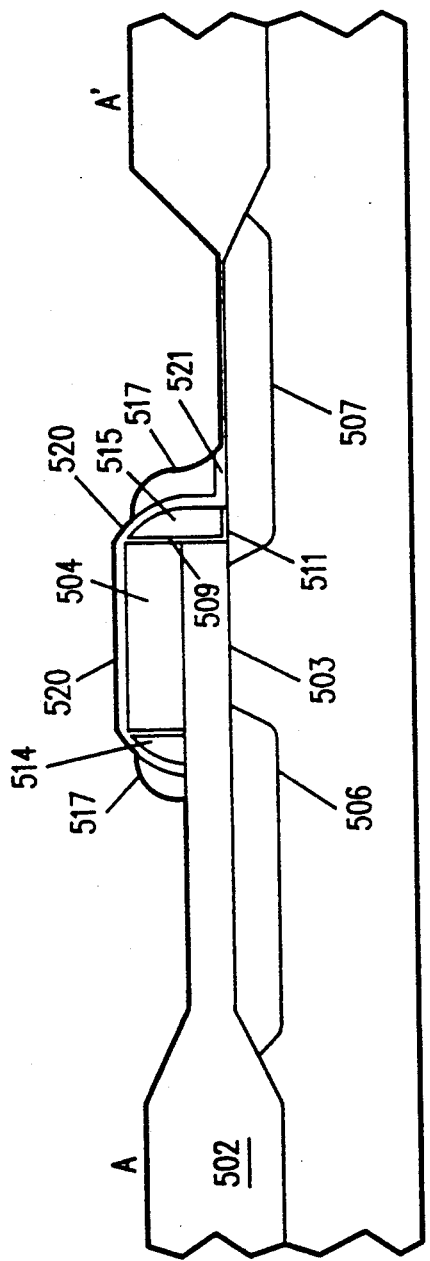
Figure 5K:
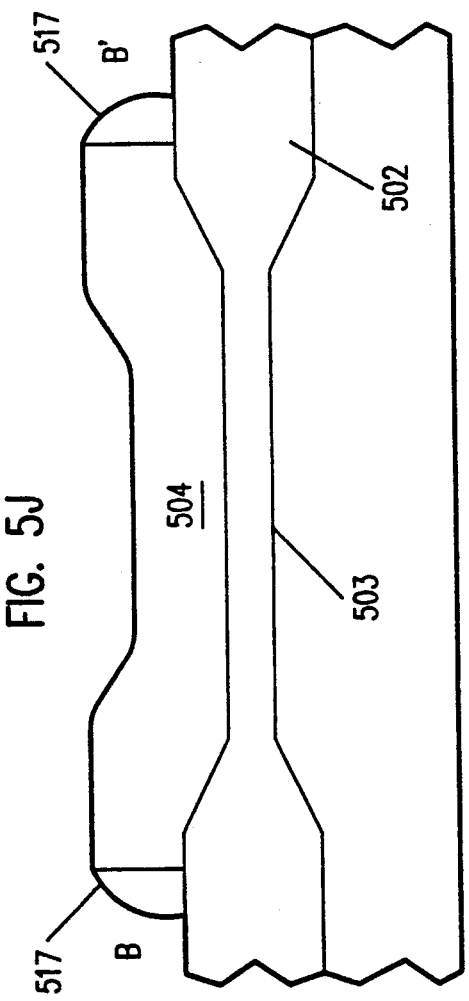

As shown in plan view in FIG. 5g, a mask 516 is applied to define lines across regions 514, 504, and 515 generally perpendicular to the etch performed and shown in FIG. 5b. Dielectric layer 520 is then removed where exposed by mask 516, and polycrystalline silicon layers 514, 504, and 515 are then etched, for example in chlorine plasma, to leave the structure shown in plan view in FIG. 5h. It should be noted that following this etch, the surfaces of polycrystalline silicon regions 514, 504, and 515 are bare, and clear of oxide, along the edges defined by mask 516.

A thin layer of polycrystalline silicon is then deposited to a thickness of approximately 2000Å and doped to increase its conductivity as desired. An anisotropic etch, for example using chlorine plasma, is then used to create a narrow polycrystalline silicon extension 517, as shown in plan view in FIG. 5i. The width W of this extension is within the range of approximately 1500 to 2000Å. Oxides 520 and 521 will serve as suitable "etch-stops" to prevent the plasma etch from attacking polycrystalline silicon regions 514, 504, and 515, or drain region 507. Polycrystalline silicon region 517 is in immediate contact with the oxide-free ends of regions 514, 504, and 515 that were created during the etch of polycrystalline silicon regions 514, 504, and 515 utilizing mask 516. In this way, an electrical connection is formed between floating gate 504 and floating gate extension 515, which is located on top of tunnel dielectric 511 on the drain 507. This structure is further illustrated in FIGS. 5j and 5k as cross-sections through the planes A-A' and B-B, shown in FIG. 5i. It should be noted that extension 517 lies on top of silicon dioxide layer 521 on drain 515, and so is prevented from contributing to the tunneling action between extension 515 and drain 507.

As shown in FIG. 5l, oxide layer 520 lying above floating gate 504 is removed, for example by a buffered HF etch. A layer of dielectric 518 is then deposited on the structure, for example an oxide-nitride-oxide (ONO) sandwich of a thickness of approximately 300Å. If desired, a photoresist mask can be patterned to protect the memory cell and allow ONO layer 518 to be removed from other elements of the circuit by means of plasma etching, for example.

A final layer of polycrystalline silicon is then deposited to a thickness of approximately 4000Å, and doped to increase its conductivity as desired. This layer is then patterned and etched using well known techniques in order to form control gate 519, as shown in FIG. 5m.

Of particular significance in this embodiment of the invention, tunnel oxide region 511 on top of drain 507 is immediately covered and protected by polycrystalline silicon spacer 515, with no intervening process steps, thereby preventing degradation of the quality of tunnel oxide 511. Another key advantage of this embodiment is that dielectric layer 518 on top of floating gate 504 is not subjected to any damaging etch prior to its being protected by deposition of the final polycrystalline silicon layer 519.

Figure 6:
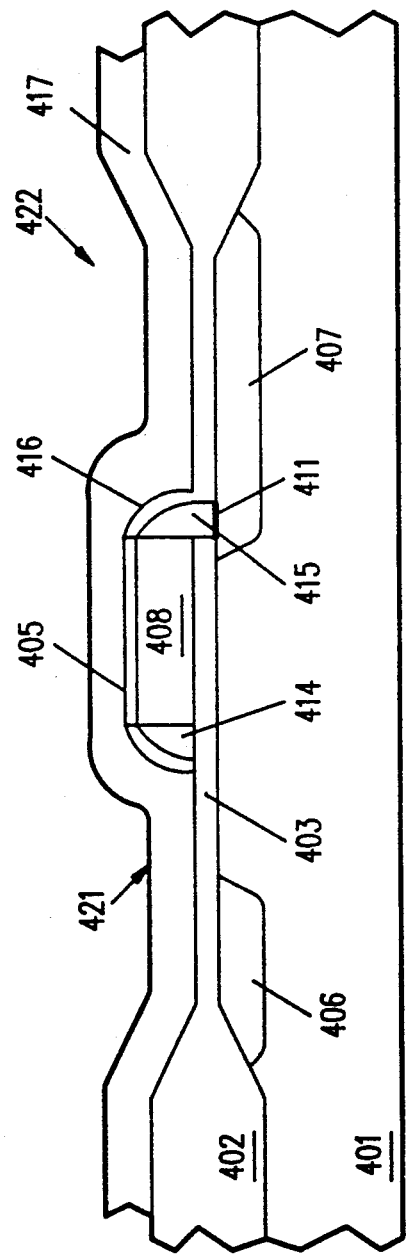
FIG. 6 is a cross-sectional view of one embodiment of a flash EEPROM memory cell including memory transistor and access transistor, which have been structured in accordance with the teachings of this invention.

The teachings of this invention are useful for any type of non-volatile memory cell where a small tunnel dielectric region is desired. For example, FIG. 6 is a cross-sectional view of one embodiment of a flash memory cell constructed in accordance with the teachings of this invention. In the embodiment of FIG. 6, the teachings of this invention are used to form a self-aligned tunnel dielectric region 411 above drain region 407. In the embodiment shown in FIG. 6, the word line is formed by polycrystalline silicon layer 417 extending across the cell in a first direction, and the source 406 and drain 407 of the cell are formed as N+regions running perpendicular to the word line. The flash EEPROM cell of FIG. 6 is programmed and erased by tunneling carriers between floating gate 408 and drain 407 through tunnel dielectric 411.

Figure 7:
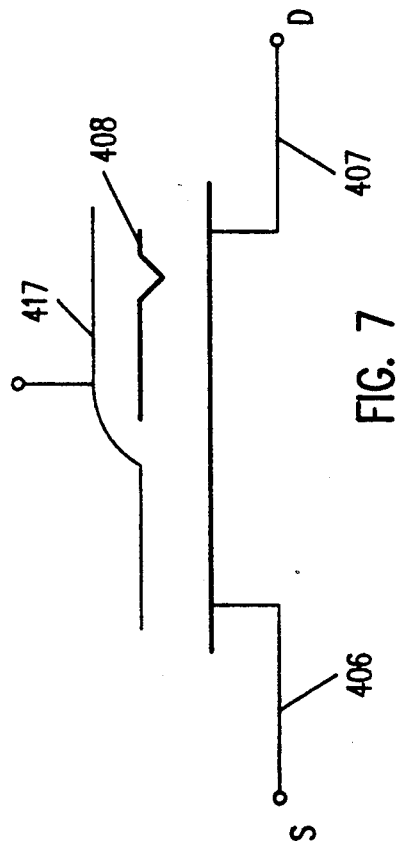
FIG. 7 is a schematic diagram depicting the circuit shown in the structure of FIG. 5.

FIG. 7 is a schematic diagram depicting the flash EEPROM cell of FIG. 6.

Thus, in accordance with the teachings of this invention, a novel structure and method are taught which allows formation of a tunnel dielectric region having very small surface area, thereby improving integrated circuit density as well as increasing coupling ratio. The tunnel dielectric region is formed self-aligned to the drain edge of the cell so that cell performance is not affected by misalignment of tunnel oxide to floating gate polysilicon. Furthermore, the drain junction terminates on relatively thick gate dielectric, rather than the relatively thin tunnel dielectric. This allows an appreciable increase in the gated breakdown voltage of the drain junction by reducing the gate oxide electric field.

The invention now being fully described, it will be apparent to one of ordinary skill in the art that many changes and modifications can be made thereto without departing from the spirit or scope of the appended claims. For example, while the embodiment described generally utilized polycrystalline silicon as the floating gate material and the floating gate extension material, other material suitable for use as the floating gate may be utilized. Similarly, while the tunnel dielectric is, in the preferred embodiment, oxide, other dielectrics such as nitride and combinations of oxide and nitride can be used as the various dielectric within the EEPROM cell, including the tunnel dielectric. It is also to be understood that the steps of forming the floating gate electrode and floating gate electrode extension can also be used to simultaneously form one or more layers of electrical interconnections.

What is claimed is:

1. A method for forming a semiconductor device having a first and a second source/drain region, a channel having a second side adjacent said second source/drain region and a second side adjacent said second source/drain region, a floating gate electrode, and a tunnel dielectric, comprising the steps of:

forming a gate dielectric layer on a semiconductor substrate;

forming a floating gate electrode on said gate dielectric layer;

forming a floating gate electrode on said gate dielectric source/drain region;

forming a floating gate electrode extension on said tunnel dielectric adjacent to at least that portion of said floating gate electrode on said first side of said channel, comprising the steps of:

forming a first dielectric layer on the sides and top of said floating gate electrode;

forming said floating gate electrode extension at least on said side of said floating gate electrode adjacent said first source/drain region such that said region is not electrically coupled to said floating gate electrode;

forming a second dielectric layer above at least said floating gate electrode extension;

patterning said first and second dielectric layers, floating gate electrode, and floating gate electrode extension so as to expose an edge of said dielectric layers, floating gate electrode, and floating gate electrode extension; and forming an electrical connection region to electrically couple said floating gate electrode and said floating gate electrode extension; and forming a thicker gate dielectric layer on that portion of said first source/drain not covered by said floating gate electrode extension.

2. A method as in claim 1 wherein said floating gate electrode extension is formed on said second source/drain side of said floating gate electrode and said first source/drain side of said gate electrode.

3. A method as in claim 1 wherein said floating gate electrode and said floating gate electrode extension comprise polycrystalline silicon.

4. A method as in claim 1 wherein said step of forming said floating gate electrode extension comprises the steps of:

forming a layer of conductive material on the top of said device; and etching said layer of conductive material, thereby leaving said floating gate electrode extension.

5. A method as in claim 4 wherein said layer of conductive material comprises polycrystalline silicon.

6. A method as in claim 4 wherein said step of etching comprises the step of anisotropically etching.

7. A method as in claim 5 wherein said step of etching comprises the step of anisotropically etching.

8. A method as in claim 1 which further comprises the steps of:

forming an intergate dielectric layer over said floating gate electrode and said floating gate electrode extension; and forming a control gate over said intergate dielectric layer.

9. A method as in claim 1 wherein said step of patterning said dielectric layer, floating gate electrode, and floating gate electrode extension so as to expose an edge of said dielectric layer, floating gate electrode, and floating gate electrode extension comprises the step of exposing an edge of said dielectric layer, floating gate electrode, and floating gate electrode extension in a direction substantially parallel to said channel region extending between said first and second source/drain regions.

10. A method as in claim 1 wherein said step of forming a dielectric layer above at least said floating gate electrode extension comprises the step of forming a dielectric layer also above at least a portion of said first source/drain region.

11. A method as in claim 10 wherein said step of forming an electrical connection region comprises the step of forming an electrical connection region also above at least a portion of said dielectric layer above said portion of said first source/drain region.

12. A method as in claim 1 wherein said step of forming an electrical connection region comprises the steps of:

forming a layer of electrically conductive material such that it is in electrical contact with at least a portion of said floating gate electrode and at least a portion of said floating gate electrode extension; and patterning said layer of electrically conductive material such that is remains in electrical connection with at least a portion of said floating gate electrode and at least a portion of said floating gate electrode extension.

13. A method as in claim 12 wherein said step of patterning comprises the step of anisotropically etching said layer of electrically conductive material.

* * * * *